(12) United States Patent
Kraver et al.

(10) Patent No.: US 9,157,945 B2
(45) Date of Patent: Oct. 13, 2015

(54) ELECTRO-MECHANICAL OSCILLATOR AND COMMON-MODE DETECTION CIRCUIT

(71) Applicants: Keith L. Kraver, Gilbert, AZ (US); Deyou Fang, Chandler, AZ (US); Mark E. Schlarmann, Chandler, AZ (US)

(72) Inventors: Keith L. Kraver, Gilbert, AZ (US); Deyou Fang, Chandler, AZ (US); Mark E. Schlarmann, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 289 days.

(21) Appl. No.: 14/013,792

(22) Filed: Aug. 29, 2013

(65) Prior Publication Data

US 2015/0061702 A1 Mar. 5, 2015

(51) Int. Cl.
*G01R 27/26* (2006.01)
*G01D 5/24* (2006.01)
*G01C 19/00* (2013.01)
*G06K 9/00* (2006.01)
*H03B 5/30* (2006.01)

(52) U.S. Cl.
CPC ............ *G01R 27/2605* (2013.01); *G01C 19/00* (2013.01); *G01D 5/24* (2013.01); *G06K 9/0002* (2013.01); *H03B 5/30* (2013.01)

(58) Field of Classification Search
CPC .... G01R 27/02; G01R 27/26; G01R 27/2605; G01R 27/28; G01R 27/32; G01R 1/30; G01D 5/24; G01D 5/2417; G06K 9/0002; G01C 19/00; H03B 5/30

USPC .......... 324/686, 658, 649, 600, 519, 548, 661
See application file for complete search history.

(56) References Cited

U.S. PATENT DOCUMENTS

| | | | |
|---|---|---|---|
| 6,469,916 B1* | 10/2002 | Kerkman et al. | 363/41 |
| 6,817,244 B2 | 11/2004 | Platt | |
| 2004/0116160 A1* | 6/2004 | Deas et al. | 455/570 |
| 2005/0174128 A1* | 8/2005 | Kim et al. | 324/661 |
| 2007/0108992 A1* | 5/2007 | Yanagisawa | 324/658 |
| 2007/0268026 A1* | 11/2007 | Reynolds | 324/686 |
| 2012/0200306 A1* | 8/2012 | Iwamoto et al. | 324/658 |

OTHER PUBLICATIONS

Trusov, A.A., "Gyroscope architecture with structurally forced anti-phase drivemode and linearly coupled anti-phase sense-mode," Solid-State Sensors, Actuators and Microsystems Conference, 2009. Transducers 2009. International, pp. 660,663, Jun. 21-25, 2009.

* cited by examiner

*Primary Examiner* — Hoai-An D Nguyen
(74) *Attorney, Agent, or Firm* — Ingrassia Fisher & Lorenz, P.C.

(57) ABSTRACT

A multi-mass resonator and a common-mode detection circuit are provided. The common-mode detection circuit, for example, may include a plurality of sensing electrodes, an interface circuit configured to interface with the plurality of sensing electrodes, and a common-mode capacitance extractor circuit electrically coupled in parallel to the interface circuit and configured to detect common-mode capacitance between the plurality of sensing electrodes and output a voltage representative the detected common-mode capacitance, and a differential-mode capacitance extractor circuit electrically coupled in parallel to the interface circuit and configured to detect differential-mode capacitance between the plurality of sensing electrodes and output a voltage representative the detected differential-mode capacitance.

20 Claims, 5 Drawing Sheets

ELECTRO-MECHANICAL OSCILLATOR AND COMMON-MODE DETECTION CIRCUIT

TECHNICAL FIELD

The following relates to electrical circuits, and more particularly to electro-mechanical oscillators and common-mode detection circuits.

BACKGROUND

Multi-mass resonators are used for implementing gyroscopes and a variety of other tools. In the case of gyroscopes, multi-mass resonators include at least two masses which are driven in a differential manner. In other words, the masses are driven such that the masses are moving away from each other in a first half of a period and towards each other in a second half of the period. However, in some instances the proof masses may move in a common-mode manner. In other words, the proof masses may move in the same direction for at least a portion of the period.

DESCRIPTION OF THE DRAWING FIGURES

Exemplary embodiments will hereinafter be described in conjunction with the following drawing figures, wherein like numerals denote like elements.

DETAILED DESCRIPTION

According to various exemplary embodiments, a multi-mass resonator and a common-mode detection circuit are provided. Compared to a single-mass system, the multi-mass system provides opportunity to reject undesired forces (e.g. linear acceleration). The common-mode detection circuit detects common-mode motion in the multi-mass resonator. Common-mode motion can corrupt the output of the multi-mass resonator and could potentially damage the device. Accordingly, the multi-mass resonator includes a common driver which outputs a drive signal to the proof masses of the multi-mass resonator to either cancel or dampen common-mode motion of the proof masses, as discussed in further detail below.

Figure 1:
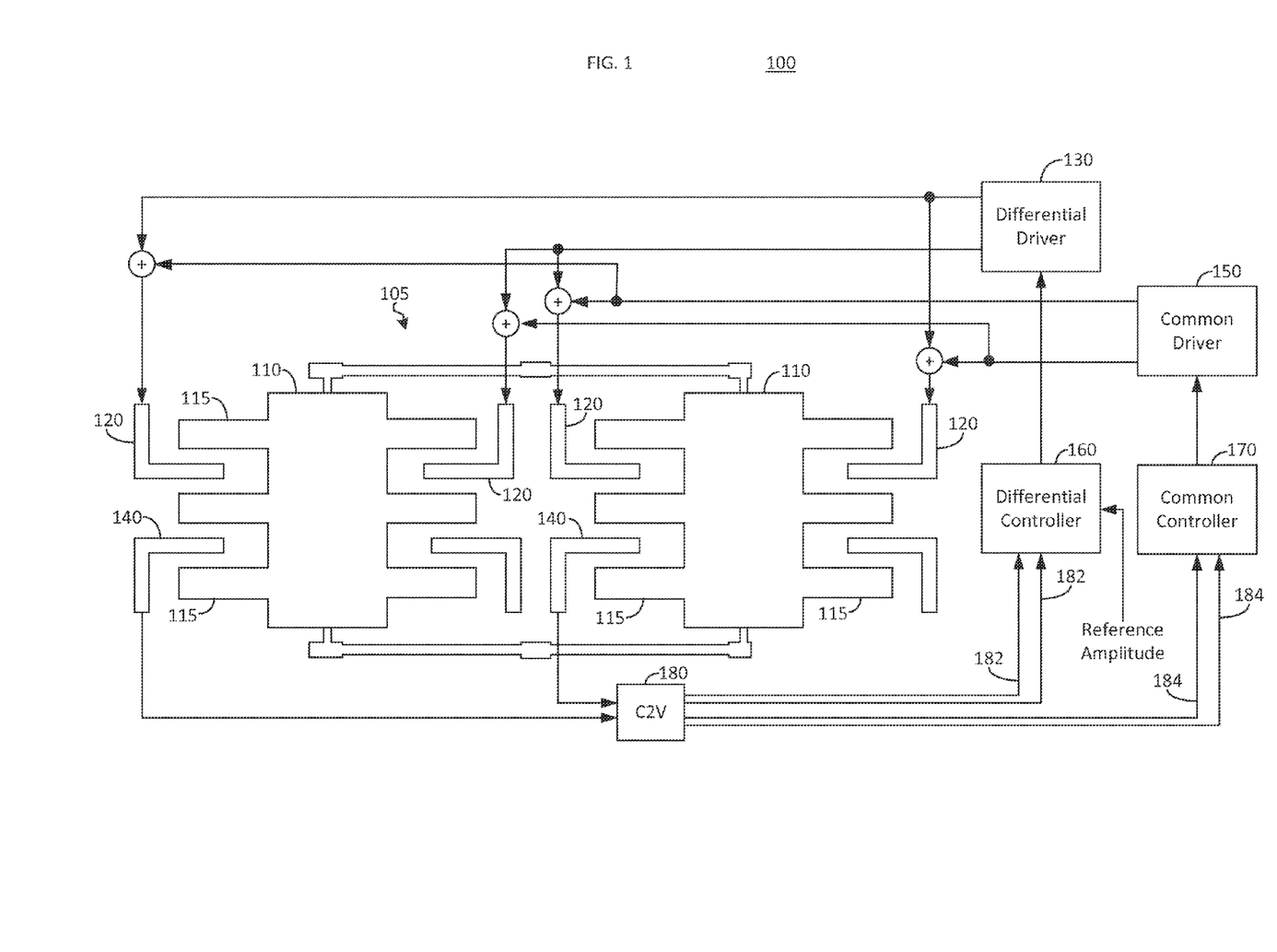
FIG. 1 is a block diagram of an exemplary electro-mechanical oscillator, in accordance with an embodiment.

FIG. 1 is a block diagram of an exemplary electro-mechanical oscillator 100, in accordance with an embodiment. Electro-mechanical oscillator 100 consists of a mechanical resonator 105 and various electronic circuit blocks, as discussed in detail in subsequent paragraphs. In one embodiment, for example, the resonator in electro-mechanical oscillator 100 may be part of a multi-mass microelectromechanical (MEMS) gyroscope which measures the strength of the coriolis force acting on the oscillating masses. Multi-mass MEMS gyroscopes can be used in a variety of mechanical or electronic devices for tracking changes in orientation or rate of rotation of a device. Cameras, for example, use gyroscopes for vibration stabilization. Automotive vehicles, for example, often uses multi-mass MEMS gyroscopes to detect a yaw rate in dynamic stability control systems.

The electro-mechanical oscillator 100 includes at least two proof masses 110. The proof masses 110 may be fabricated from any mass suitable for use in a multi-mass resonator system. In one embodiment, for example, the proof masses 110 may be formed from a layer of silicon formed on a wafer. Each proof mass 110 includes a series of electrodes 115 arranged in a comb-like pattern.

Figure 2:
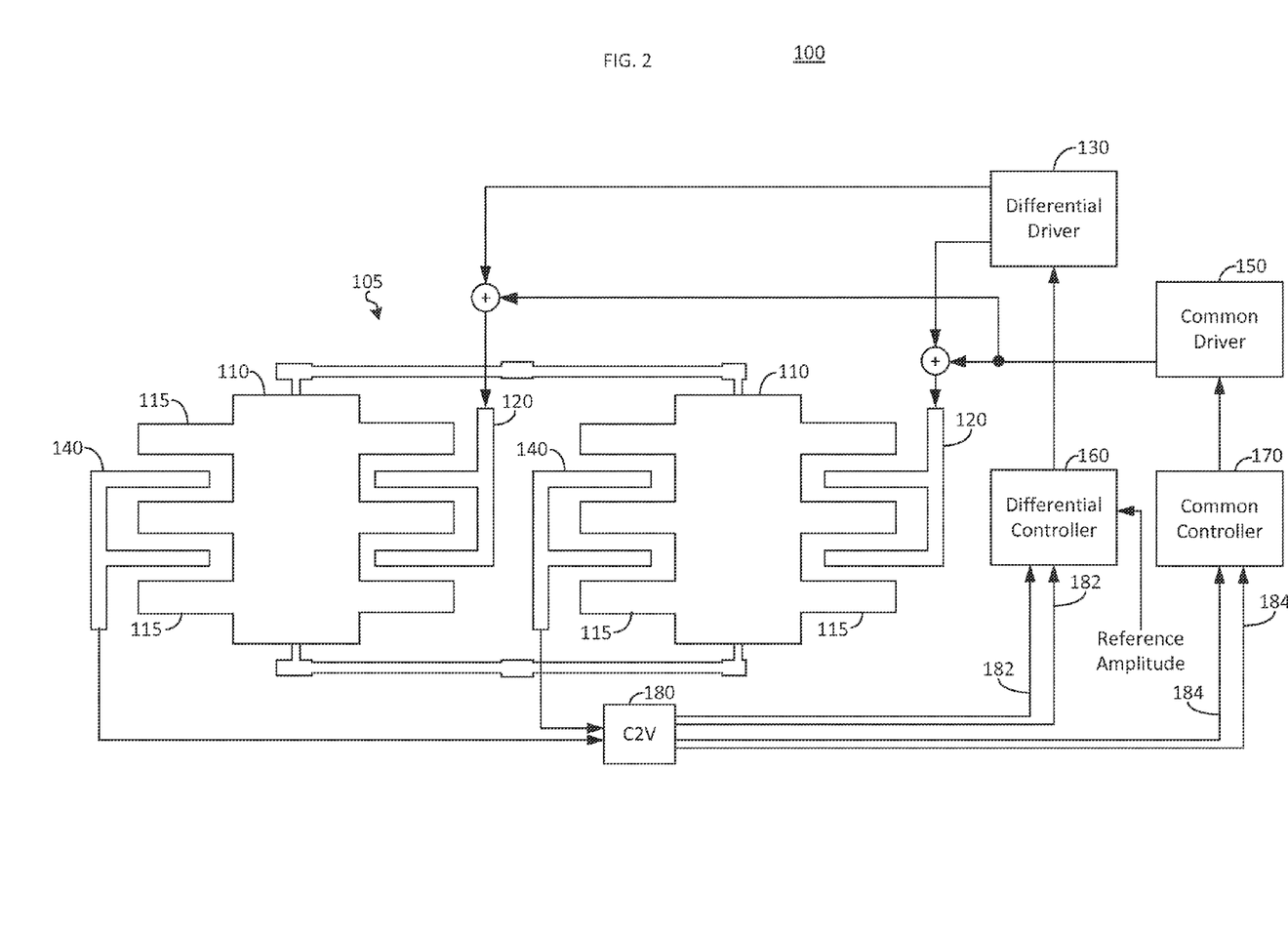
FIG. 2 is a block diagram of another exemplary electro-mechanical oscillator, in accordance with an embodiment.

Most multi-mass resonator systems are designed to drive the proof masses 110 in a differential (otherwise known as anti-phase) manner. In other words, the masses 110 would be driven such that masses 110 move away from each other in a first half of a period and move towards each other in a second half of a period. In order to drive the movement of the masses 110, the electro-mechanical oscillator 100 includes electrodes 120. In the embodiment illustrated in FIG. 1, there are four electrodes 120, two arranged on each side of each proof mass 110. However, the number of electrodes can vary and the number of comb-like protrusions on each electrode can vary. As seen in FIG. 2, for example, only one electrode 120 is arranged on each side of the proof mass 110.

The electrodes 120 are arranged between the electrodes 115 of the proof masses 110. Accordingly, the electrodes 115 and electrodes 120 form capacitors. The electrodes 120 are coupled to a differential driver 130 though a summing operation. The differential driver 130 outputs a signal to the electrodes 120 which cause the proof masses to oscillate in the differential manner at a resonant frequency via an electrostatic force.

The electro-mechanical oscillator 100 further includes sensing electrodes 140. Each sensing electrode includes at least one protrusion which is arranged between two electrodes 115 of a proof mass 110. In FIG. 1, for example, there are two electrodes 140, However, the number of electrodes 140 and the number of protrusions on each electrode 140 can vary. As seen in FIG. 2, for example, only one electrode 140 is arranged proximate to each proof mass 110. Furthermore, the electrodes 140 in FIG. 2 include multiple comb-like protrusions. The electrodes 115 and electrodes 140 form capacitors. As the proof masses 110 move a capacitance change is created between electrodes 115 and 140.

In some instances, however, the proof masses may move in a common-mode (otherwise known as in-phase) manner. In other words, at some point in each period of oscillation, the masses may both move in the same direction rather than in the opposite directions as desired. This can be caused for a variety of reasons, for example, a phone being dropped, when a car hits a curb, or a variety of other reasons. In the embodiment shown in FIGS. 1 and 2 the proof masses 110 move in a linear direction. However, in other embodiment, for example, the proof masses 110 may be configured to move in a rotational direction.

In order to correct for the common-mode motion, the electro-mechanical oscillator 100 further includes a common-mode driver 150. The common mode driver is coupled to the electrodes 120. As seen in FIGS. 1 and 2, the signals from the differential driver 130 and common-mode driver 150 are added together to maintain the desirable differential motion of the proof masses 110. Differential driver 130 and common driver 150 provide additional gain to the respective signals and typically operate from a higher voltage supply than the other electrical circuit blocks to provide the necessary electrostatic force to the sensor masses.

The differential driver 130 is coupled to a differential controller 160. The differential controller 160 controls the differential driver 130 to control the differential (or anti-phase) oscillation of the proof masses. Likewise, the common-mode driver 150 is coupled to a common controller 170. The common controller 170 controls the common-mode driver to cancel out any common-mode (or in-phase) motion of the proof masses. The controllers provide high-gain in the frequency band of interest to control the mechanical motion and compensation to ensure that the control loop is stable. In the case of the differential controller 160, the amplitude of the anti-phase motion is set to a desired level. In contrast, common controller 170 attenuates the in-phase displacement to a level as close to zero as possible.

The differential controller 160 and common controller 170 are coupled to a capacitance-to-voltage (C2V) circuit 180. In one embodiment, for example, the C2V circuit 180 may be implemented in an application specific integrated circuit (ASIC). The C2V circuit 180 is coupled to the sensing electrodes 140 and outputs a differential control signal 182 to the differential controller 160 and a common-mode control signal 184 to the common controller 170. The differential control signal 182 is a feedback signal which is used by the differential controller 160 to maintain the differential motion of the proof masses 110. The common-mode control signal 184 is used by the common controller 170 to either dampen or cancel out any common-mode motion of the proof masses.

Figure 3:
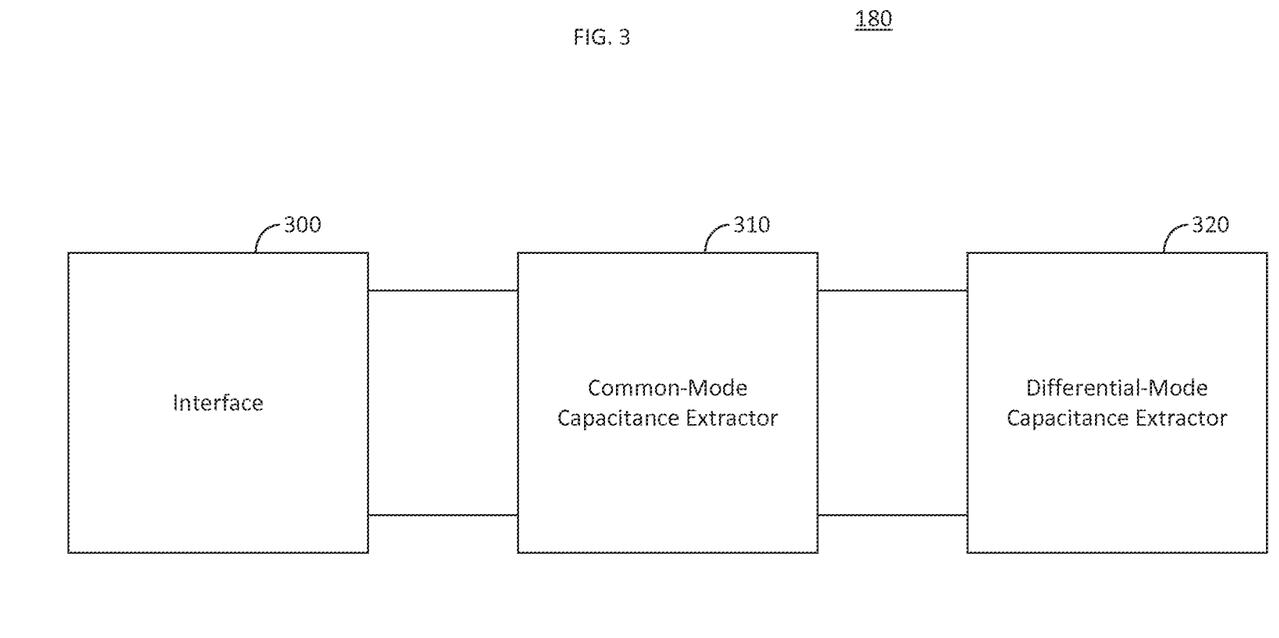
FIG. 3 is a block diagram of an exemplary C2V circuit, in accordance with an embodiment.

FIG. 3 is a block diagram of an exemplary C2V circuit 180, in accordance with an embodiment. The C2V circuit 180 includes an interface circuit 300 for interfacing with the electrodes 140 of the electro-mechanical oscillator 100. The C2V circuit 180 further includes a common-mode capacitance extractor 310 and a differential-mode capacitance extractor 320 electrically coupled in parallel with the interface 300. The common-mode capacitance extractor 310 extracts a common-mode capacitive component from the measured capacitance of the electro-mechanical oscillator 100 and outputs a voltage representative of the common-mode capacitive component. Likewise, the differential-mode capacitance extractor 320 extracts a differential-mode capacitive component from the measured capacitance of the electro-mechanical oscillator 100 and outputs a voltage representative of the differential-mode capacitive component.

Figure 4:
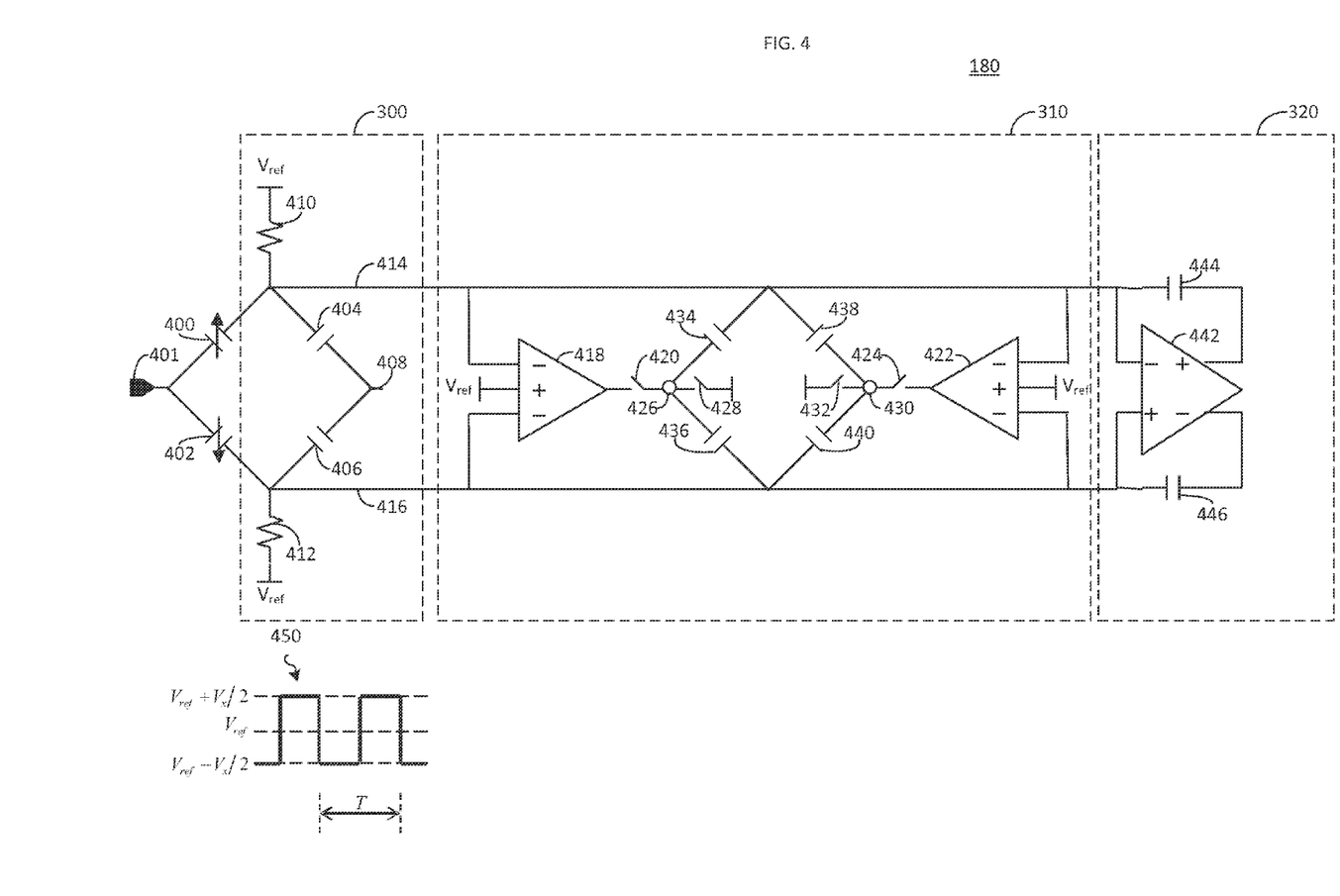
FIG. 4 is a circuit level diagram of another exemplary C2V circuit in accordance with an embodiment.

FIG. 4 is a circuit level diagram of an exemplary C2V circuit 180 in accordance with an embodiment. As discussed above, the electrodes 115 of the proof mass 110 and the sensing electrodes 140 form capacitors. The capacitance of these capacitors varies based upon the displacement of the proof mass. The variable capacitors are represented by capacitors 400 and 402.

The capacitors 400 and 402 are electrically coupled in parallel with the interface circuit 300. The interface circuit 300 includes capacitors 404 and 406 which are electrically coupled in parallel with capacitors 400 and 402. Accordingly, capacitors 400-406 in interface circuit 300 are effectively arranged in a bridge. The common terminal of capacitors 400 and 402, a node 401, is driven by an excitation voltage waveform 450 to induce a charge transfer through the aforementioned capacitors. A node 408 between capacitors 404 and 406 is configured to receive an electrical signal inverse of the excitation voltage waveform 450 applied to node 401. Generally capacitors 404 and 406 are equal in value to capacitors 400 and 402 when proof masses 110 are at zero displacement. The excitation waveform can be a square wave or a sine wave or any other suitable waveform. Accordingly, the charge injected from capacitors 404 and 406 cancels the common-mode charge injected into lines 414 and 416 caused by the excitation voltage waveform 450 applied to node 401. In other words, capacitors 404 and 406 cancel the static common-mode charge due to the nominal (zero-displacement) capacitances 400 and 402.

Capacitors 400 and 404 are electrically coupled to a first end of a resistor 410. The second end of the resistor 410 is coupled to a reference voltage Vref. Likewise, capacitors 402 and 406 are electrically coupled to a first end of a resistor 412. The second end of the resistor 412 is coupled to a reference voltage Vref. The resistors 410 and 412 aid in keeping the lines 414 and 416, which run the length of the C2V circuit 180, at an average voltage of Vref.

The common-mode capacitance extractor 310 includes an operational amplifier (op-amp) 418. The op-amp 418 includes a first negative input coupled to line 414, a second negative input coupled to line 416 and a positive input coupled to Vref. The output of the op-amp 418 is coupled to a first end of a switch 420. The common-mode capacitance extractor 310 further includes an op-amp 422. The op-amp 422 includes a first negative input coupled to line 414, a second negative input coupled to line 416 and a positive input coupled to Vref. The output of the op-amp 422 is coupled to a first end of a switch 424. The op-amps 418 and 422, as part of a feedback loop, detect a common-mode voltage on lines 414 and 416 due to excess common-mode charge not compensated by capacitors 404 and 406 and the voltage applied to node 408. The common-mode charge is due to a common-mode capacitance shift in capacitors 400 and 402. As discussed in further detail below, the op-amp 418 detects the common-mode motion during a first half of a period and the op-amp 422 detects the common-mode motion during a second half of a period.

The second end of the switch 420, identified as node 426 is coupled to a first end of a switch 428. The second end of the switch 428 is coupled to the reference voltage Vref. The second end of the switch 424, identified as node 430 is coupled to a first end of a switch 432. The second end of the switch 432 is coupled to the reference voltage Vref.

The common-mode capacitance extractor 310 further includes four capacitors arranged in a bridge formation. A capacitor 434 is coupled between line 414 and the node 426. A capacitor 436 is coupled between node 426 and line 416. A capacitor 438 is coupled between line 414 and the node 430. A capacitor 440 is coupled between node 430 and line 416. The capacitors 434-440 provide charge based on the signals from the op-amps 418 and 422 to help cancel or attenuate common-mode voltage shifts on lines 414 and 416 and thus common-mode motion of proof mass 110 and also aid in either dampening or cancelling the common-mode motion. In one embodiment, for example, capacitors 434-440 are all of the same capacitance, for example.

Switches 420 and 432 are controlled by the electrical clock signal in phase with the electrical signal applied to node 408. Switches 424 and 428 are controlled by the electrical clock signal in phase with electrical signal applied to node 401. Accordingly, switches 424 and 428 may be closed during a first half of the period and open during the second half of the period. Likewise, switches 420 and 432 may be open during a first half of the period and closed during the second half of the period.

The signals at nodes 426 and 430 form the common-mode control signal 184. They are coupled to a common controller, such as the common controller 170 illustrated in FIG. 1. The voltages at the nodes 426 and 430 are controlled by the output of op-amps 418 and 422 and capacitors 434-440. The voltage achieved is the voltage necessary to cancel the excess common-mode charge on nodes 414 and 416 and is related to common-mode motion of proof mass 110. The difference in voltage between nodes 426 and 430 is proportional to the common-mode motion of proof mass 110 and can be determined via Equation 1:

$$\Delta V_C(nT) = V_{C1}\left(nT - \frac{T}{2}\right) - V_{C2}(nT) = \frac{V_x}{2}\left(\frac{C_0(nT) + C_0\left(nT - \frac{T}{2}\right)}{C_{icm}}\right) \quad \text{Equation 1}$$

Where T is the length of the period of the excitation voltage, n is the period number (i.e. 1, 2, 3, . . . ), $V_{c1}$ is the voltage at node 426, $V_{c2}$ is the voltage at node 430, $V_x$ is a peak-to-peak voltage of excitation voltage waveform 450 applied to node 401, $C_{icm}$ is the capacitance of one of capacitors 434-440, and $C_0$ is the average capacitance of capacitors 400 and 402 (i.e., $(C_{400}+C_{402})/2$). Common controller 170 is coupled to nodes 426 and 430 as illustrated in FIGS. 1 and 2 and either cancels or dampens the common mode motion based upon the voltage at the nodes 426 and 430.

The differential-mode capacitance extractor 320 includes an op-amp 442 having a first input electrically coupled to line 414 and a second input coupled to line 416. The op-amp 442 further includes a first output and a second output. A capacitor 444 is coupled between the first input and the first output. Likewise, a capacitor 446 is coupled between the second input and the second output. The first output and the second output are also coupled to a differential controller as illustrated in FIGS. 1 and 2. As discussed above, the differential-mode capacitance extractor 320 detects differential motion of the proof masses and outputs a feedback signal to the differential controller to help maintain the oscillation of the proof masses at the desired frequency and amplitude.

Figure 5:
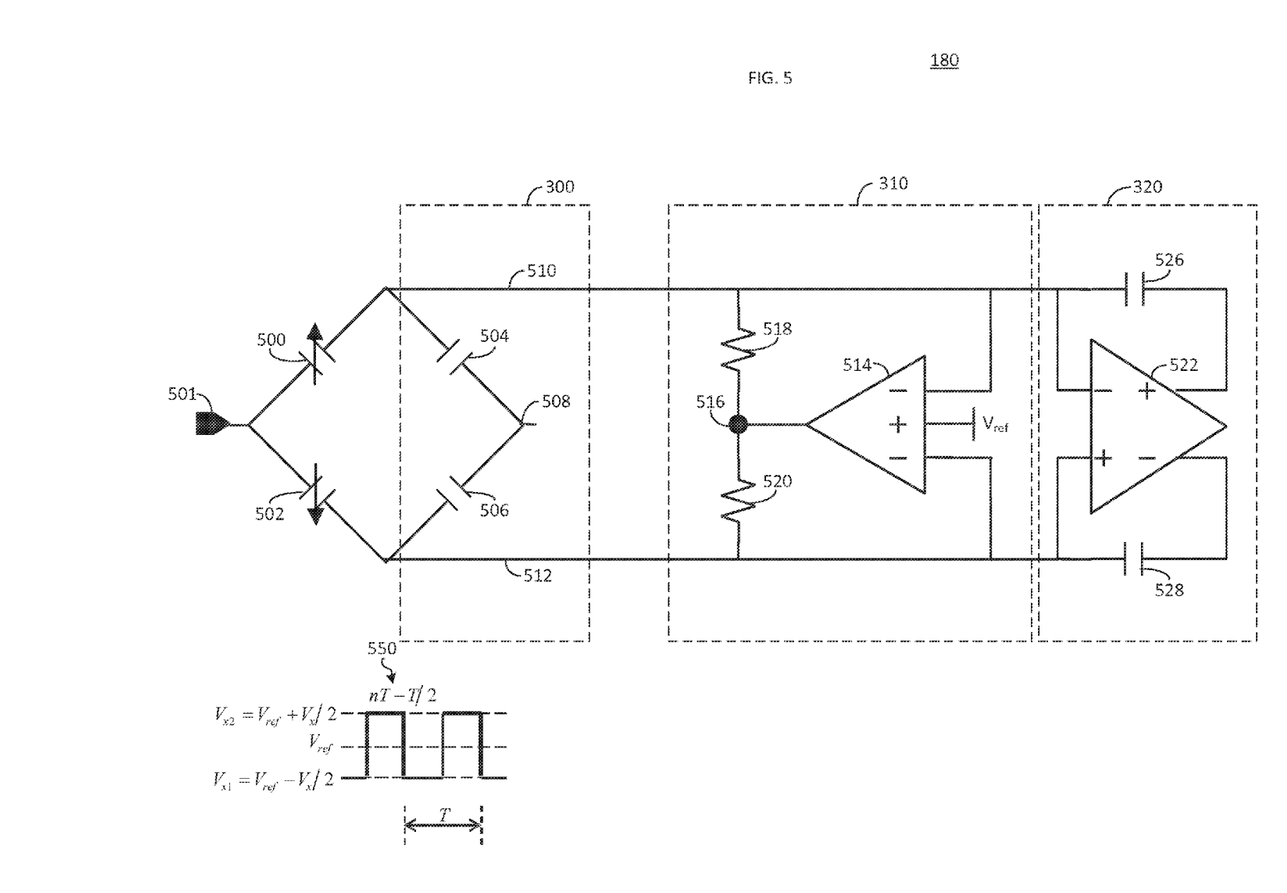
FIG. 5 is a circuit level diagram of another exemplary C2V circuit in accordance with an embodiment.

FIG. 5 is a circuit level diagram of another exemplary C2V circuit 180 in accordance with an embodiment. As discussed above, the electrodes 115 of the proof mass 110 and the sensing electrodes 140 form capacitors. The capacitance of these capacitors varies based upon the displacement of the proof mass. The variable capacitors are represented by capacitors 500 and 502 in FIG. 5.

The capacitors 500 and 502 are electrically coupled in parallel with the interface circuit 300. The interface circuit 300 includes capacitors 504 and 506 which are electrically coupled in parallel with capacitors 500 and 502. Accordingly, capacitors 500-506 in the interface circuit 300 are effectively arranged in a bridge. The common terminal of capacitors 500 and 502, a node 501, is driven by an excitation voltage waveform 550 to generate charge in the aforementioned capacitors. A node 508 between capacitors 504 and 506 is configured to receive an electrical signal inverse of the signal applied to node 501. Generally capacitors 504 and 506 are equal in value to capacitors 500 and 502 when proof masses 110 are at zero displacement. The excitation waveform can be a square wave or a sine wave or any other suitable waveform. Accordingly, the capacitors 504 and 506 cancel the common-mode charge injected into lines 510 and 512 caused by the excitation voltage waveform 550, applied to node 501. In other words, capacitors 504 and 506 cancel the static common-mode charge due to the nominal (zero-displacement) capacitances 500 and 502.

Capacitors 500 and 504 are coupled to a line 510 which runs the length of the C2V circuit 180. Likewise, capacitors 502 and 506 are coupled to a line 512 which runs the length of the C2V circuit 180.

The C2V circuit 180 further includes a common-mode capacitance extractor 310. The common-mode capacitance extractor 310 includes an op-amp 514. The op-amp 514 includes a first inverting input coupled to line 510, a inverting negative input coupled to line 512 and a non-inverting input coupled to a reference voltage Vref. The output of the op-amp 514 is coupled to a node 516. A resistor 518 is coupled between the node 516 and the line 510. Another resistor 520 is coupled between the node 516 and the line 512. A reasonable resistance value for resistors 518 and 520 is 100 MΩ, but other resistor values are possible. The op-amp 514 detects common-mode motion by comparing the common-mode voltage on lines 510 and 512 to Vref due to the excess common-mode charge not removed by capacitors 504 and 506 and the voltage applied to 508. The resistors 518 and 520 provide feedback to the op-amp to aid in detecting the common-mode motion of the proof mass 110 by canceling the common-mode charge on nodes 510 and 512 due to the common-mode motion. The output of the op-amp 514 provides a derivative of the common-mode capacitance change with respect to time. Sampling and subtracting the common-mode output (node 516) periodically (related to the timing of the excitation voltage) produces a result that is proportional to the time derivative (or rate of change) of the common-mode sensor capacitance; see Equation 2:

$$\Delta V_C(nT) = V_C\left(nT - \frac{T}{2}\right) - V_C(nT) = \quad \text{Equation 2}$$
$$R_{icm}\left[V_{x1}\frac{d}{dT}C_0(nT) - V_{x2}\frac{d}{dT}C_0(nT - T/2)\right]$$

Where T is the period of the excitation voltage, n is the period number (i.e. 1, 2, 3, . . . ), $V_c$ is the voltage at node 516, $V_{x1}$ is the maximum value of the excitation voltage (Vref plus one-half of the peak-to-peak value of the excitation voltage), $V_{x2}$ is the minimum value of the excitation voltage (Vref minus one-half of the peak-to-peak value of the excitation voltage), $R_{icm}$ is the capacitance of one of resistors 518 or 520, and $C_0$ is the average capacitance of capacitors 500 and 502 (i.e., $(C_{500}+C_{502})/2$). The common controller 170 is coupled to the node 516 which provides a signal to the common-mode driver 150 to cancel or dampen any common-mode motion based upon the voltage at node 516. This embodiment is particularly suited to damping the motion since the common-mode extraction circuit inherently computes the rate of change of the common-mode capacitance.

The differential-mode capacitance extractor 320 includes an op-amp 522 having a first input electrically coupled to line 510 and a second input coupled to line 512. The op-amp 522 further includes a first output and a second output. A capacitor 526 is coupled between the first input and the first output. Likewise, a capacitor 528 is coupled between the second input and the second output. The first output and the second output are also coupled to a differential controller as illustrated in FIGS. 1 and 2. As discussed above, the differential-mode capacitance extractor 320 detects differential motion of the proof masses and outputs a feedback signal to the differential controller to help maintain the oscillation of the proof masses at the desired frequency and amplitude.

In one exemplary embodiment, for example, an electromechanical oscillator is provided. The electro-mechanical oscillator may include a plurality of proof masses, a plurality of sensing electrodes arranged proximate to the plurality of proof masses, and a capacitance to voltage circuit coupled to the plurality of sensing electrodes, the capacitance to voltage circuit including an interface circuit configured to interface with the plurality of sensing electrodes, a common-mode capacitance extractor circuit electrically coupled in parallel to the interface circuit and configured to output a voltage representative of common-mode motion of the plurality of proof masses, and a differential-mode capacitance extractor circuit electrically coupled in parallel to the interface circuit and configured to output a voltage representative of differential-mode motion of the plurality of proof masses. In one embodiment, for example, the plurality of proof masses are configured to receive an excitation signal and the interface circuit is further configured to remove a common-mode disturbance from the capacitance-to-voltage circuit based upon the excitation signal. In one embodiment, for example, the interface circuit further includes a first resistor having a first end and a second end, wherein the first end of the first resistor is configured to be coupled to a reference voltage, and the second end of the first resistor is electrically coupled to a first of the plurality of sensing electrodes, a first capacitor having a first end and a second end, wherein the first end of the first capacitor is electrically coupled to the second end of the first resistor and the second end of the first capacitor is configured to be coupled to the reference voltage, a second resistor having a first end and a second end, wherein the first end of the second resistor is configured to be coupled to the reference voltage, and the second end of the second resistor is electrically coupled to a second of the plurality of sensing electrodes, and a second capacitor having a first end and a second end, wherein the first end of the second capacitor is configured to be coupled to the second end of the first capacitor, and the second end of the second capacitor is electrically coupled to the second end of the second. In one embodiment, for example, the common-mode capacitance extractor circuit further comprises two operational amplifiers electrically coupled in parallel with a capacitor bridge. In one embodiment, for example, the common-mode capacitance extractor circuit further includes a first operational amplifier having a first input electrically coupled to a first of the plurality of sensing electrodes, a second input electrically coupled to a second of the plurality of sensing electrodes, a third input electrically coupled to a reference voltage, and an output, a second operational amplifier having a first input electrically coupled to the first of the plurality of sensing electrodes, a second input electrically coupled to the second of the plurality of sensing electrodes, a third input electrically coupled to the reference voltage, and an output, a first capacitor electrically coupled between the output of the first operational amplifier and the first of the plurality of sensing electrodes, a second capacitor electrically coupled between the output of the first operational amplifier and the second of the plurality of sensing electrodes, a third capacitor electrically coupled between the output of the second operational amplifier and the first of the plurality of sensing electrodes, and a fourth capacitor electrically coupled between the output of the second operational amplifier and the second of the plurality of sensing electrodes. In one embodiment, for example, the common-mode capacitance extractor circuit further includes a first switch electrically coupled between the output of the first operational amplifier and the first capacitor, a second switch electrically coupled between the first capacitor and the reference voltage, a third switch electrically coupled between the output of the second operational amplifier and the third capacitor, and a fourth switch electrically coupled between the third capacitor and the reference voltage. In one embodiment, for example, the first switch and the fourth switch are configured to be controlled by a first control signal, and the second switch and the third switch are configured to be controlled by a second control signal, wherein the second control signal is an inverse of the first control signal. In one embodiment, for example, the common-mode capacitance extractor circuit further includes an operational amplifier having a first input electrically coupled to a first of the plurality of sensing electrodes, a second input electrically coupled to a second of the plurality of sensing electrodes, a third input configured to be coupled to a reference voltage, and an output, a first resistor electrically coupled between the output of the operational amplifier and the first of the plurality of sensing electrodes, and a second resistor electrically coupled between the output of the operational amplifier and the second of the plurality of sensing electrodes. In one embodiment, for example, the differential-mode capacitance extractor circuit further includes an operational amplifier having a first input electrically coupled to a first of the plurality of sensing electrodes, a second input electrically coupled to a second of the plurality of sensing electrodes, a first output and a second output, a first capacitor coupled between the first output of the operational amplifier and the first of the plurality of sensing electrodes, and a second capacitor coupled between the second output of the operational amplifier and the second of the plurality of sensing electrodes. In one embodiment, for example, the electro-mechanical oscillator further includes a common-controller configured to receive the voltage representative of common-mode motion of the plurality of proof masses from the common-mode capacitance extractor circuit, the common-controller configured to output a drive signal to the plurality of proof masses to cancel a common-mode motion based upon the voltage representative of common-mode motion of the plurality of proof masses. In one embodiment, for example, the electro-mechanical oscillator further includes a common-controller configured to receive the voltage representative of common-mode motion of the plurality of proof masses from the common-mode capacitance extractor circuit, the common-controller configured to output a drive signal to the plurality of proof masses to dampen a common-mode motion based upon the voltage representative of common-mode motion of the plurality of proof masses.

In one exemplary embodiment, for example, a common-mode detection circuit is provided. The common-mode detection circuit may include a plurality of sensing electrodes, an interface circuit configured to interface with the plurality of sensing electrodes, a common-mode capacitance extractor circuit electrically coupled in parallel to the interface circuit and configured to detect common-mode capacitance between the plurality of sensing electrodes and output a voltage representative the detected common-mode capacitance, and a differential-mode capacitance extractor circuit electrically coupled in parallel to the interface circuit and configured to detect differential-mode capacitance between the plurality of sensing electrodes and output a voltage representative the detected differential-mode capacitance. In one exemplary embodiment, for example the interface circuit is further configured to remove a common-mode disturbance from the common-mode detection circuit based upon an excitation signal. In one exemplary embodiment, for example the interface circuit further includes a first resistor having a first end and a second end, wherein the first end of the first resistor is configured to be coupled to a reference voltage, and the second end of the first resistor is electrically coupled to a first of the plurality of sensing electrodes, a first capacitor having a first end and a second end, wherein the first end of the first capacitor is electrically coupled to the second end of the first resistor and the second end of the first capacitor is configured to be coupled to the reference voltage, a second resistor having a first end and a second end, wherein the first end of the second resistor is configured to be coupled to the reference voltage, and the second end of the second resistor is electrically coupled to a second of the plurality of sensing electrodes, and a second capacitor having a first end and a second end, wherein the first end of the second capacitor is configured to be coupled to the second end of the first capacitor, and the second end of the second capacitor is electrically coupled to the second end of the second. In one exemplary embodiment, for example the common-mode capacitance extractor circuit further comprises two operational amplifiers electrically coupled in parallel with a capacitor bridge. In one exemplary embodiment, for example the common-mode capacitance extractor circuit further includes a first operational amplifier having a first input electrically coupled to a first of the plurality of sensing electrodes, a second input electrically coupled to a second of the plurality of sensing electrodes, a third input electrically coupled to a reference voltage, and an output, a second operational amplifier having a first input electrically coupled to the first of the plurality of sensing electrodes, a second input electrically coupled to the second of the plurality of sensing electrodes, a third input electrically coupled to a reference voltage, and an output, a first capacitor electrically coupled between the output of the first operational amplifier and the first of the plurality of sensing electrodes, a second capacitor electrically coupled between the output of the first operational amplifier and the second of the plurality of sensing electrodes, a third capacitor electrically coupled between the output of the second operational amplifier and the first of the plurality of sensing electrodes, and a fourth capacitor electrically coupled between the output of the second operational amplifier and the second of the plurality of sensing electrodes. In one exemplary embodiment, for example the common-mode capacitance extractor circuit further includes a first switch electrically coupled between the output of the first operational amplifier and the first capacitor, a second switch electrically coupled between the first capacitor and a reference voltage, a third switch electrically coupled between the output of the second operational amplifier and the third capacitor, and a fourth switch electrically coupled between the third capacitor and the reference voltage. In one exemplary embodiment, for example the first switch and the fourth switch are configured to be controlled by a first control signal, and the second switch and the third switch are configured to be controlled by a second control signal, wherein the second control signal is an inverse of the first control signal. In one exemplary embodiment, for example the common-mode capacitance extractor circuit further includes an operational amplifier having a first input electrically coupled to a first of the plurality of sensing electrodes, a second input electrically coupled to a second of the plurality of sensing electrodes, a third input configured to be coupled to a reference voltage, and an output, a first resistor electrically coupled between the output of the operational amplifier and the first of the plurality of sensing electrodes; and a second resistor electrically coupled between the output of the operational amplifier and the second of the plurality of sensing electrodes. In one exemplary embodiment, for example the differential-mode capacitance extractor circuit further includes an operational amplifier having a first input electrically coupled to a first of the plurality of sensing electrodes, a second input electrically coupled to a second of the plurality of sensing electrodes, a first output and a second output, a first capacitor coupled between the first output of the operational amplifier and the first of the plurality of sensing electrodes, and a second capacitor coupled between the second output of the operational amplifier and the second of the plurality of sensing electrodes.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. An electro-mechanical oscillator comprising:
    a plurality of proof masses;
    a plurality of sensing electrodes arranged proximate to the plurality of proof masses; and
    a capacitance to voltage circuit coupled to the plurality of sensing electrodes, the capacitance to voltage circuit comprising:
        an interface circuit configured to interface with the plurality of sensing electrodes;
        a common-mode capacitance extractor circuit electrically coupled in parallel to the interface circuit and configured to output a voltage representative of common-mode motion of the plurality of proof masses; and
        a differential-mode capacitance extractor circuit electrically coupled in parallel to the interface circuit and configured to output a voltage representative of differential-mode motion of the plurality of proof masses.

2. The electro-mechanical oscillator of claim 1, wherein the plurality of proof masses are configured to receive an excitation signal and the interface circuit is further configured to remove a common-mode disturbance from the capacitance-to-voltage circuit based upon the excitation signal.

3. The electro-mechanical oscillator of claim 1, wherein the interface circuit further comprises:
    a first resistor having a first end and a second end, wherein the first end of the first resistor is configured to be coupled to a reference voltage, and the second end of the first resistor is electrically coupled to a first of the plurality of sensing electrodes;
    a first capacitor having a first end and a second end, wherein the first end of the first capacitor is electrically coupled to the second end of the first resistor and the second end of the first capacitor is configured to be coupled to the reference voltage;
    a second resistor having a first end and a second end, wherein the first end of the second resistor is configured to be coupled to the reference voltage, and the second end of the second resistor is electrically coupled to a second of the plurality of sensing electrodes; and
    a second capacitor having a first end and a second end, wherein the first end of the second capacitor is configured to be coupled to the second end of the first capacitor, and the second end of the second capacitor is electrically coupled to the second end of the second.

4. The electro-mechanical oscillator of claim 1, wherein the common-mode capacitance extractor circuit further comprises two operational amplifiers electrically coupled in parallel with a capacitor bridge.

5. The electro-mechanical oscillator of claim 1, wherein the common-mode capacitance extractor circuit further comprises:

a first operational amplifier having a first input electrically coupled to a first of the plurality of sensing electrodes, a second input electrically coupled to a second of the plurality of sensing electrodes, a third input electrically coupled to a reference voltage, and an output;

a second operational amplifier having a first input electrically coupled to the first of the plurality of sensing electrodes, a second input electrically coupled to the second of the plurality of sensing electrodes, a third input electrically coupled to the reference voltage, and an output;

a first capacitor electrically coupled between the output of the first operational amplifier and the first of the plurality of sensing electrodes;

a second capacitor electrically coupled between the output of the first operational amplifier and the second of the plurality of sensing electrodes;

a third capacitor electrically coupled between the output of the second operational amplifier and the first of the plurality of sensing electrodes; and a fourth capacitor electrically coupled between the output of the second operational amplifier and the second of the plurality of sensing electrodes.

6. The electro-mechanical oscillator of claim 5, wherein the common-mode capacitance extractor circuit further comprises:

a first switch electrically coupled between the output of the first operational amplifier and the first capacitor;

a second switch electrically coupled between the first capacitor and the reference voltage;

a third switch electrically coupled between the output of the second operational amplifier and the third capacitor; and a fourth switch electrically coupled between the third capacitor and the reference voltage.

7. The electro-mechanical oscillator of claim 6, wherein the first switch and the fourth switch are configured to be controlled by a first control signal, and the second switch and the third switch are configured to be controlled by a second control signal, wherein the second control signal is an inverse of the first control signal.

8. The electro-mechanical oscillator of claim 1, wherein the common-mode capacitance extractor circuit further comprises:

an operational amplifier having a first input electrically coupled to a first of the plurality of sensing electrodes, a second input electrically coupled to a second of the plurality of sensing electrodes, a third input configured to be coupled to a reference voltage, and an output;

a first resistor electrically coupled between the output of the operational amplifier and the first of the plurality of sensing electrodes; and a second resistor electrically coupled between the output of the operational amplifier and the second of the plurality of sensing electrodes.

9. The electro-mechanical oscillator of claim 1, wherein the differential-mode capacitance extractor circuit further comprises:

an operational amplifier having a first input electrically coupled to a first of the plurality of sensing electrodes, a second input electrically coupled to a second of the plurality of sensing electrodes, a first output and a second output;

a first capacitor coupled between the first output of the operational amplifier and the first of the plurality of sensing electrodes; and a second capacitor coupled between the second output of the operational amplifier and the second of the plurality of sensing electrodes.

10. The electro-mechanical oscillator of claim 1, further comprising a common-controller configured to receive the voltage representative of common-mode motion of the plurality of proof masses from the common-mode capacitance extractor circuit, the common-controller configured to output a drive signal to the plurality of proof masses to cancel a common-mode motion based upon the voltage representative of common-mode motion of the plurality of proof masses.

11. The electro-mechanical oscillator of claim 1, further comprising a common-controller configured to receive the voltage representative of common-mode motion of the plurality of proof masses from the common-mode capacitance extractor circuit, the common-controller configured to output a drive signal to the plurality of proof masses to dampen a common-mode motion based upon the voltage representative of common-mode motion of the plurality of proof masses.

12. A common-mode detection circuit, comprising:

a plurality of sensing electrodes;

an interface circuit configured to interface with the plurality of sensing electrodes;

a common-mode capacitance extractor circuit electrically coupled in parallel to the interface circuit and configured to detect common-mode capacitance between the plurality of sensing electrodes and output a voltage representative the detected common-mode capacitance; and a differential-mode capacitance extractor circuit electrically coupled in parallel to the interface circuit and configured to detect differential-mode capacitance between the plurality of sensing electrodes and output a voltage representative the detected differential-mode capacitance.

13. The common-mode detection circuit of claim 12, wherein the interface circuit is further configured to remove a common-mode disturbance from the common-mode detection circuit based upon an excitation signal.

14. The common-mode detection circuit of claim 12, wherein the interface circuit further comprises:

a first resistor having a first end and a second end, wherein the first end of the first resistor is configured to be coupled to a reference voltage, and the second end of the first resistor is electrically coupled to a first of the plurality of sensing electrodes;

a first capacitor having a first end and a second end, wherein the first end of the first capacitor is electrically coupled to the second end of the first resistor and the second end of the first capacitor is configured to be coupled to the reference voltage;

a second resistor having a first end and a second end, wherein the first end of the second resistor is configured to be coupled to the reference voltage, and the second end of the second resistor is electrically coupled to a second of the plurality of sensing electrodes; and a second capacitor having a first end and a second end, wherein the first end of the second capacitor is configured to be coupled to the second end of the first capacitor, and the second end of the second capacitor is electrically coupled to the second end of the second.

15. The common-mode detection circuit of claim 12, wherein the common-mode capacitance extractor circuit further comprises two operational amplifiers electrically coupled in parallel with a capacitor bridge.

16. The common-mode detection circuit of claim 12, wherein the common-mode capacitance extractor circuit further comprises:

a first operational amplifier having a first input electrically coupled to a first of the plurality of sensing electrodes, a second input electrically coupled to a second of the plurality of sensing electrodes, a third input electrically coupled to a reference voltage, and an output;

a second operational amplifier having a first input electrically coupled to the first of the plurality of sensing electrodes, a second input electrically coupled to the second of the plurality of sensing electrodes, a third input electrically coupled to a reference voltage, and an output;

a first capacitor electrically coupled between the output of the first operational amplifier and the first of the plurality of sensing electrodes;

a second capacitor electrically coupled between the output of the first operational amplifier and the second of the plurality of sensing electrodes;

a third capacitor electrically coupled between the output of the second operational amplifier and the first of the plurality of sensing electrodes; and a fourth capacitor electrically coupled between the output of the second operational amplifier and the second of the plurality of sensing electrodes.

17. The common-mode detection circuit of claim 16, wherein the common-mode capacitance extractor circuit further comprises:
- a first switch electrically coupled between the output of the first operational amplifier and the first capacitor;
- a second switch electrically coupled between the first capacitor and a reference voltage;
- a third switch electrically coupled between the output of the second operational amplifier and the third capacitor; and
- a fourth switch electrically coupled between the third capacitor and the reference voltage.

18. The common-mode detection circuit of claim 17, wherein the first switch and the fourth switch are configured to be controlled by a first control signal, and the second switch and the third switch are configured to be controlled by a second control signal, wherein the second control signal is an inverse of the first control signal.

19. The common-mode detection circuit of claim 12, wherein the common-mode capacitance extractor circuit further comprises:
- an operational amplifier having a first input electrically coupled to a first of the plurality of sensing electrodes, a second input electrically coupled to a second of the plurality of sensing electrodes, a third input configured to be coupled to a reference voltage, and an output;
- a first resistor electrically coupled between the output of the operational amplifier and the first of the plurality of sensing electrodes; and
- a second resistor electrically coupled between the output of the operational amplifier and the second of the plurality of sensing electrodes.

20. The common-mode detection circuit of claim 12, wherein the differential-mode capacitance extractor circuit further comprises:
- an operational amplifier having a first input electrically coupled to a first of the plurality of sensing electrodes, a second input electrically coupled to a second of the plurality of sensing electrodes, a first output and a second output;
- a first capacitor coupled between the first output of the operational amplifier and the first of the plurality of sensing electrodes; and
- a second capacitor coupled between the second output of the operational amplifier and the second of the plurality of sensing electrodes.

* * * * *